(12) United States Patent
Gotkis et al.

(10) Patent No.: US 6,894,491 B2
(45) Date of Patent: May 17, 2005

(54) METHOD AND APPARATUS FOR METROLOGICAL PROCESS CONTROL IMPLEMENTING COMPLEMENTARY SENSORS

(75) Inventors: Yehiel Gotkis, Fremont, CA (US); Rodney Kistler, Los Gatos, CA (US); Aleksander Owczarz, San Jose, CA (US); David Hemker, San Jose, CA (US); Nicolas J. Bright, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 69 days.

(21) Appl. No.: 10/328,884

(22) Filed: Dec. 23, 2002

(65) Prior Publication Data

US 2004/0119468 A1 Jun. 24, 2004

(51) Int. Cl.[7] .............................. G01B 7/06; G01R 33/12
(52) U.S. Cl. ....................... 324/230; 324/233; 324/243; 324/225
(58) Field of Search ................................. 324/225, 243, 324/230, 229, 238, 240, 233; 702/38; 438/7; 427/8–10

(56) References Cited

U.S. PATENT DOCUMENTS

| | | | | |
|---|---|---|---|---|
| 3,815,017 A | * | 6/1974 | Nopper et al. | 324/230 |
| 5,525,903 A | * | 6/1996 | Mandl et al. | 324/230 |
| 5,559,428 A | * | 9/1996 | Li et al. | 324/71.5 |
| 6,040,694 A | * | 3/2000 | Becker | 324/230 |

* cited by examiner

Primary Examiner—Jay Patidar
Assistant Examiner—Reena Aurora
(74) Attorney, Agent, or Firm—Martine & Penilla, LLP

(57) ABSTRACT

A method for detecting a thickness of a layer of a wafer is provided. The method includes defining a particular radius of a wafer carrier configured to engage the wafer to be processed. The method also includes providing a plurality of sensors configured to create a set of complementary sensors. Further included in the method is distributing the plurality of sensors along the particular radius within the wafer carrier such that each sensor of the plurality of sensors is out of phase with an adjacent sensor by a same angle. The method also includes measuring signals generated by the plurality of sensors. Further included is averaging the signals generated by the plurality of sensors so as to generate a combination signal. The averaging is configured to remove noise from the combination signal such that the combination signal is capable of being correlated to identify the thickness of the layer.

21 Claims, 14 Drawing Sheets

METHOD AND APPARATUS FOR
METROLOGICAL PROCESS CONTROL
IMPLEMENTING COMPLEMENTARY
SENSORS

BACKGROUND OF THE INVENTION

1. Field of the Invention

The present invention relates generally to semiconductor wafer preparation and more specifically to in situ metrology for process parameter control during wafer processing.

2. Description of the Related Art

As is well known, semiconductor fabrication includes several stages during which an underlying substrate is subjected to the formation and removal of various layers. The continuous demand for smaller feature sizes and tighter surface planarity in conjunction with the constant quest to increase wafer throughput requires implementing a process state monitoring and endpoint detection method capable of discontinuing the processing of a target layer once a target thickness has been achieved.

Recently, eddy cunent sensors (ECS) are starting to be used to measure changes in film properties. For more information on these new methodologies for using eddy current sensors, reference may be made to "INTEGRATION OF EDDY CURRENT SENSOR BASED METROLOGY WITH SEMICONDUCTOR FABRICATION TOOLS" having the U.S. patent application Ser. No: 10/186,472, filed on Jun. 28, 2002. The disclosure of this Patent Application is incorporated herein by reference. The ECS sensors rely on the induction of a circular current in a sample by the fluctuating electromagnetic field of a test coil proximate to the object being probed. Fluctuating electromagnetic fields are created as a result of passing an alternating current through the coil. The fluctuating electromagnetic fields induce eddy currents, which perturb the applied field and change the inductance of the coil.

FIG. 1 is a simplified schematic diagram of the principle upon which an eddy current sensor operates. An alternating current flows through coil 108 defined in close proximity to the conducting object 102. The electromagnetic field of the coil 108 induces eddy currents 104 in conducting object 102. The magnitude and the phase of the eddy currents 104 in turn affect the loading on the coil 108, causing the impedance of the coil 108 to be impacted by the eddy currents 104. This impact is measured and calibrated in terms of proximity of conducting object 102 and/or thickness of the object 102 if the thickness of the object 102 is significantly less than the field penetration depth. As can be seen, distance 106 impacts the effect of eddy currents 104 on coil 108. As such, if object 102 moves, the signal from the sensor monitoring the impact of eddy currents 104 on coil 108 will also change.

In a chemical mechanical planarization (CMP) operation, a wafer carrier includes an isolated built-in eddy current sensor for measuring the thickness of the thin film layer being processed during the CMP operation. The wafer carrier includes a carrier film designed to support the wafer. During the planarization operation, the rotating carrier, the built in eddy current sensor, and wafer are pressed against the polishing pad, planarizing the surface of the wafer.

Unfortunately, using eddy current sensors for detecting an endpoint of the target layer or measuring the thickness of the target layer has certain negative aspects. For instance, the plot 200 shown in FIG. 2 depicts the eddy current sensor signals generated in a center and edge of a wafer. A graph 114 shows the changes in eddy current voltage versus time during the planarization operation. In graph 114, changes in eddy current voltage is sensed by an isolated eddy current sensor defined in the center of the wafer while a graph 116 shows the changes in eddy current voltage during the planarization operation sensed by another isolated eddy current sensor defined in the edge of the wafer. Normally, the eddy current sensor signals undulate sinusoidally, with each signal undulation following a frequency of the carrier rotation. As shown in FIG. 2, however, despite both signals undulating sinusoidally, the signal amplitude in the edge graph 116 is shown to be considerably higher than the amplitude in the center graph 114.

Furthermore, the probed thin film layer allows the electromagnetic field to penetrate the thin film layer so as to reach conductive objects located in the sensing vicinity. Generally, the configuration of the external objects is asymmetric with regard to the trajectory of the rotating sensor. However, rotational proximity variation results in sinusoidal variation in the signal amplitude attributed to rotation of the wafer carrier and thus the eddy current sensors in a non-uniform external media.

The variation in the sinusoidal signal amplitude is caused by the sensitivity of the eddy current sensors to a wide spectrum of parameters. For instance, among many other parameters, it has been established that eddy current sensors are sensitive to variation in carrier film thickness, standoff, temperature, and pressure. Additionally, the magnitude and phase of the eddy current generated in the probed thin film layer is sensitive to the properties of the thin film layer (e.g., thickness, resistivity, topography, etc.) as well as thin film layer/sensor proximity.

By way of example, the "standoff" parameter, i.e., the distance between the layer to be polished and the eddy current sensor surfaces, may differ for a number of reasons. A substantial variation in the standoff is created when the carrier film thickness varies (e.g., between +/−a few mils). The standoff further varies as a result of changes in the thickness of the carrier film due to compression of the carrier film being applied to the polishing pad with different degrees of pressure. The thickness of the carrier film and thus the standoff furthermore changes once the leading edge of the rotating wafer digs into the moving polishing pad at the point of contact. At this point, the pressure applied at the point of contact causes the carrier film to be compressed, varying the standoff, and thus the amplitude of the eddy current signal. As can be appreciated, it is extremely difficult to calibrate for all the parameters affecting the standoff, which ultimately negatively impacts the thickness measurement by the sensor.

Another variable parameter affecting the eddy current signal amplitude is having non-uniform temperature gradiance across the wafer surface. For instance, the temperature of the wafer leading edge increases as the wafer leading edge comes into contact with the moving polishing pad. Then, the temperature of the wafer trailing edge increases as the wafer trailing edge comes into contact with the polishing pad. The sensitivity of the eddy current sensor to variation in temperature, directly influences the eddy current sinusoidal signal. This again makes it extremely difficult to calibrate for temperature variances impacting the thickness measurement of the eddy current sensors.

Additionally, the sinusoidal signal amplitude differs depending on the sensor being defined within the wafer carrier close to the wafer center or the edge of the wafer. The signal amplitude increases as the sensors are defined further away from the wafer center.

As can be appreciated, the conjunctive effects of these parameters has introduced an unacceptably high amount of error and unpredictability into the thickness measurement or endpoint detection using the eddy current sensor signals, leading to underpolishing or overpolishing of the processed wafer layers, damaging the wafers and thus, reducing wafer throughput and yield.

In view of the foregoing, there is a need for a flexible methodology and system capable of determining a thickness of a target layer by controlling the process parameters.

SUMMARY OF THE INVENTION

Broadly speaking, the present invention fills these needs by determining a thickness of a wafer layer in real time or an endpoint of a wafer layer by averaging anti-phase sinusoidal signals generated by a plurality of complementary sensors defined substantially equally along a radius of a wafer carrier configured to hold the wafer to be processed. It should be appreciated that the present invention can be implemented in numerous ways, including as a process, an apparatus, a system, a device, or a method. Several inventive embodiments of the present invention are described below.

In one embodiment, a method for detecting a thickness of a layer of a wafer is provided. The method includes defining a particular radius of a wafer carrier configured to engage the wafer to be processed. The method also includes providing a plurality of sensors configured to create a set of complementary sensors. Further included in the method is distributing the plurality of sensors along the particular radius within the wafer carrier such that each sensor of the plurality of sensors is out of phase with an adjacent sensor by a same angle. The method also includes measuring signals generated by the plurality of sensors. Further included is averaging the signals generated by the plurality of sensors so as to generate a combination signal. The averaging is configured to remove noise from the combination signal such that the combination signal is capable of being correlated to identify the thickness of the layer.

In another embodiment, a method for detecting a thickness of a wafer layer of a wafer is provided. The method includes defining a particular radius of a wafer carrier designed to engage the wafer to be processed. The method further includes providing a pair of sensors and distributing the pair of sensors along the particular radius within the wafer carrier such that a first sensor of the pair of sensors is out of phase with a second sensor of the pair by a predetermined angle. The method further includes measuring signals generated by the first sensor and the second sensor of the pair of sensors. Also included is averaging the signals generated by the first sensor and the second sensor so as to generate a combination signal. The averaging is configured to remove noise from the combination signal capable of being correlated to identify the thickness of the layer.

In yet another embodiment, an apparatus for detecting a thickness of a conductive layer of a wafer configured to be engaged by a wafer carrier is provided. The apparatus includes a plurality of sensors configured to detect a signal produced by a magnetic field generated by a magnetic field enhancing source. The plurality of sensors are defined along a circle defined within the wafer carrier such that each sensor of the plurality of sensors is out of phase with an adjacent sensor by a predetermined angle. The average of signals generated by the plurality of sensors is configured to create a combination signal.

The advantages of the present invention are numerous. Most notably, the embodiments of the present invention allow implementation of any combination of equally distributed sensors defined along the same circle to eliminate signal undulation caused by the corresponding circular motion. In this manner, the sine clear signal precisely correlates to the thickness of the metal film being removed, providing a reliable process state monitoring and end point detection approach for use in fabrication process, such as a CMP process. Another advantage is that the rotationally non-disturbed combination signal is recorded in real time due to usage of algorithmic averaging procedures. The algorithmic averaging procedure advantageously allows real time monitoring metrology. Yet another advantage is that by using uniformly distributed sensors defined along a particular circle, periodic motion related (e.g., undulating) signal component is automatically and completely suppressed without requiring any additional adjustments and irrespective of complexity (i.e., signals having a simple sinusoidal or other shapes in more complicated cases). Yet another advantage is that the embodiments of the present invention can be implemented in any type of CMP system (e.g., linear CMP system, rotary table CMP system, orbital CMP system, etc.). Still another advantage is that the embodiments of the present invention can be implemented in any device implementing cyclical periodic system motion to modulate the conditions in sensing space that cause signal undulation.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Inventions for accurately determining an endpoint or a thickness of a wafer layer are provided. In one embodiment, a plurality of sinusoidal signals generated by a plurality of complementary sensors is averaged generating a sinus-suppressed signal configured to substantially correlate with the thickness of the wafer layer being processed. In one embodiment, the signals generated by a set of complementary sensors defined along a circle of a wafer carrier are averaged generating a sinus-suppressed signal significantly correlating with the thickness of the wafer layer being processed or being removed. As used herein, the term "complementary sensors" refers to a set of two or more sensors substantially uniformly distributed along a circle of the wafer carrier such that the sinusoidal component in the average of generated sine signals is substantially suppressed so as to precisely correlate with thickness of a wafer layer being processed.

In preferred embodiments, the sinusoidal component of the noise is eliminated by averaging the alternative phase signals generated by the plurality of complementary sensors. The term "noise," as used herein, refers to any factor affecting the generated signals (e.g., undulating disturbance, etc.). In this manner, the suppression sine signal can be implemented to determine the sensor signal with significantly improved signal-to-noise ratio. In one example, the plurality of sensors is eddy current sensors (ECS) sensors.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
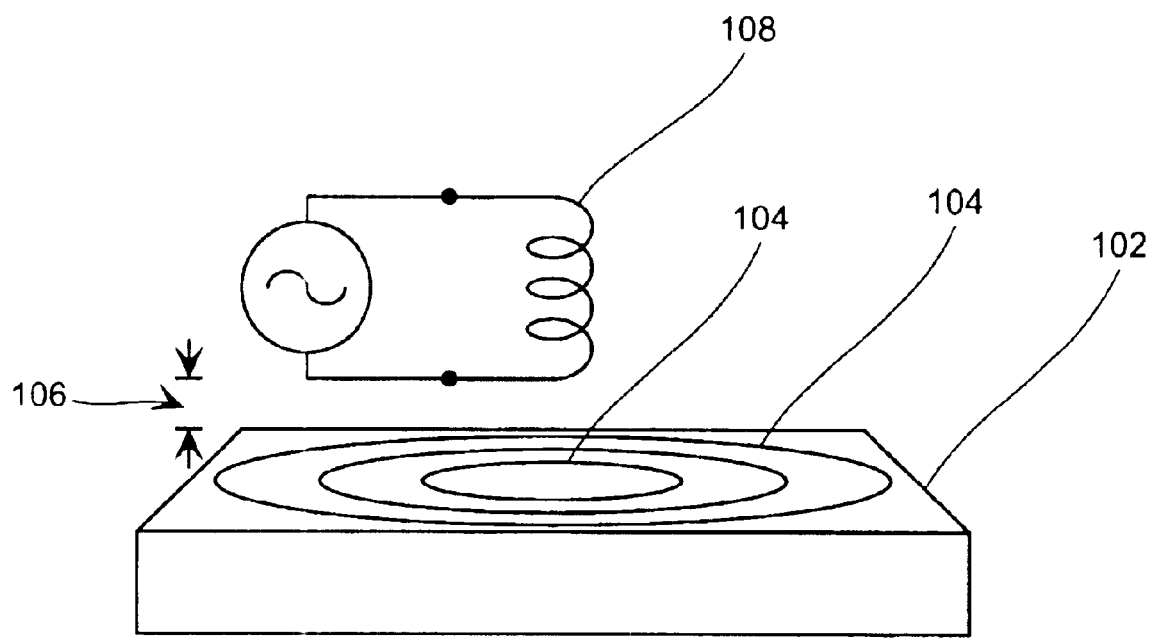
FIG. 1 is a simplified schematic diagram of the principle upon which an eddy current sensor operates.
Figure 2:
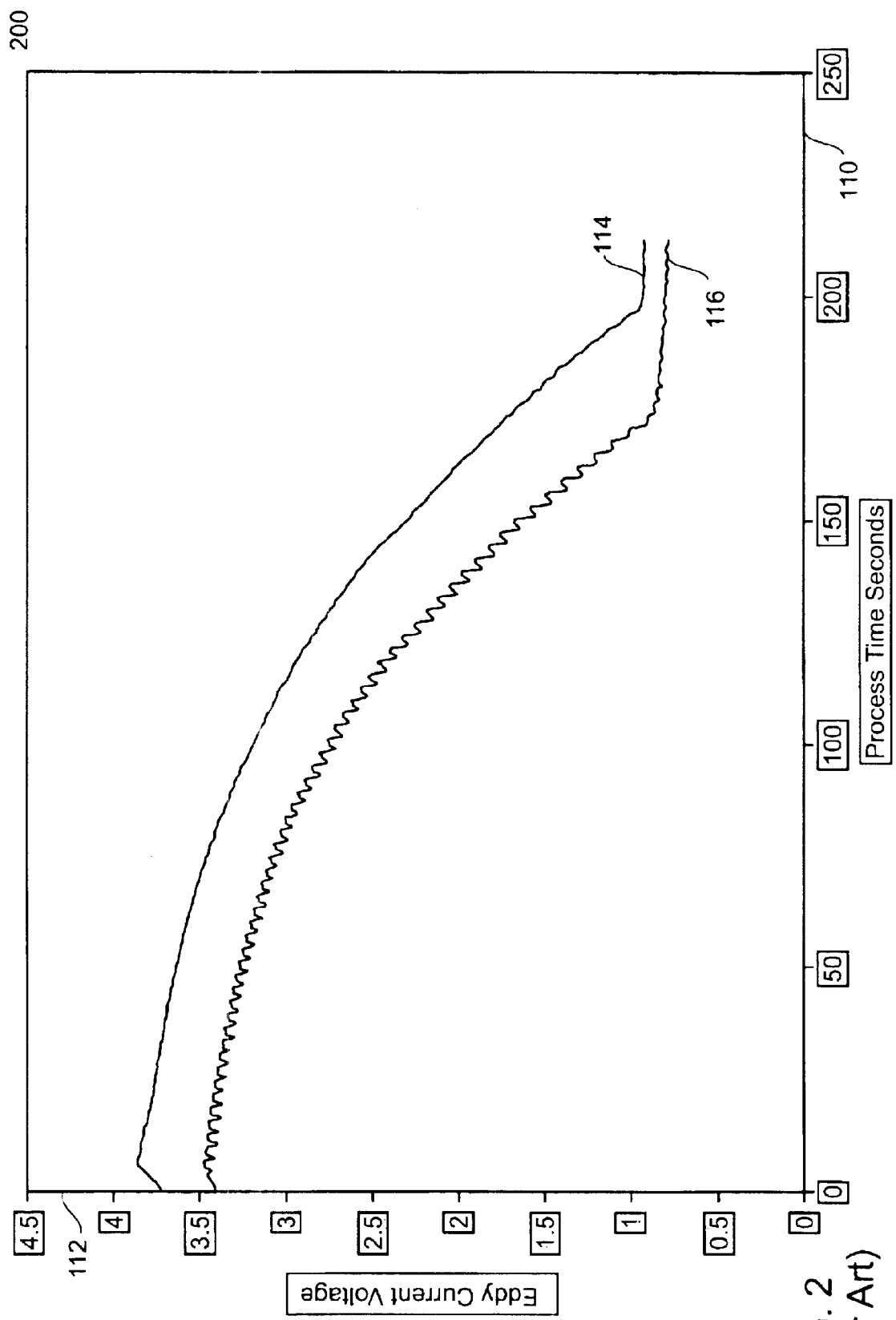
FIG. 2 shows graphs of the signal of two isolated eddy current sensors defined by the center and edge of the wafer.
Figure 3A:
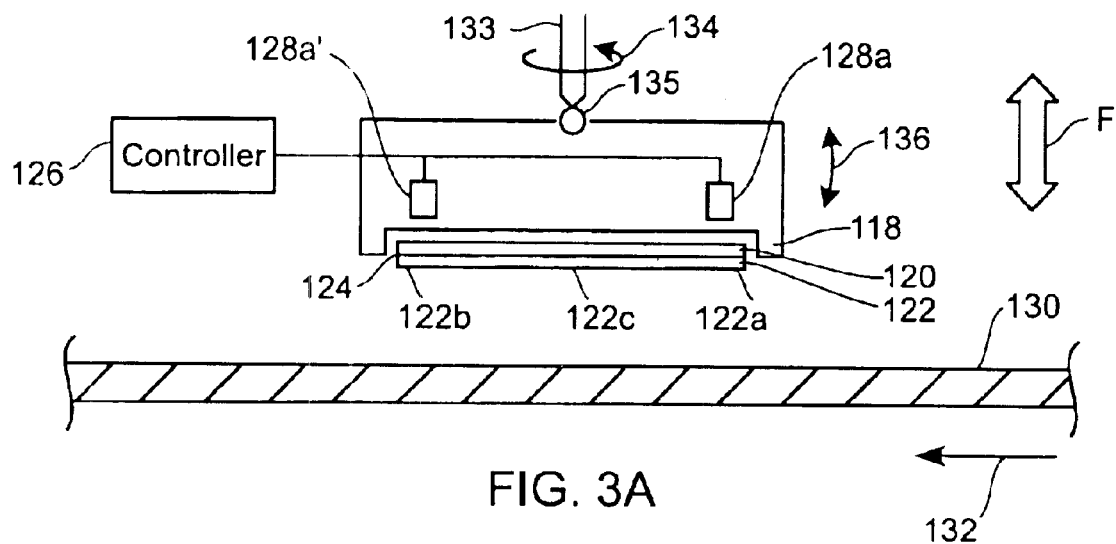
FIG. 3A is a schematic diagram of an exemplary wafer carrier including a pair of complementary eddy current sensors for measuring the thickness of a wafer layer during a chemical mechanical planarization process (CMP), in accordance with one embodiment of the present invention.

FIG. 3A is a simplified schematic diagram of an exemplary wafer carrier 118 including a pair of complementary sensors 128a and 128a' measuring a thickness of a layer of a wafer 122, in accordance with one embodiment of the present invention. In one embodiment, the complementary sensors 128a and 128a' are ECS sensors. As shown in the embodiment of FIG. 3A, the wafer carrier 118 is mounted on a carrier spindle 133 using a gimbal 135. The gimbal 135 positioned above the wafer carrier 118 is implemented to align the wafer carrier 118 and the wafer 122 to the moving polishing pad 130 during the polishing operations. As can be seen, the gimbal 135 mounted on the carrier spindle 133 is designed to rotate in the direction of wafer rotation 134. The carrier spindle 133 is configured to apply the wafer carrier 118 and thus the wafer 122 on to the moving polishing pad 130.

In one example, while the wafer carrier 118 and thus the wafer 122 rotate in the rotation direction 134, the wafer carrier 118 and the wafer 122 are applied to the polishing pad 130 with the force F. In some embodiments, despite including the gimbal 135 to align the wafer carrier 118 and the wafer 122 with a surface of the polishing pad 130, the wafer 122 is applied to the polishing pad 130 such that initially, a leading edge 122a of the wafer 122 digs into the polishing pad 130. Thereafter, the center of the wafer 122c and a trailing edge 122b come into contact with the polishing pad 130.

In another embodiment, the leading edge 122a digging into the polishing pad 130 leads to a decrease in the carrier film 120 thickness close to the leading edge 122a of the wafer. As a consequence, the standoff and thus the ECS signals being detected by the ECS sensor 128a are modified. The wafer leading edge 122a digging into the polishing wafer also increases the temperature at the wafer leading edge 122a affecting the sinusoidal undulation close to the wafer leading edge 122a. As will be described in more detail below, in one embodiment, the ECS signal detected by the ECS sensors 128a and 128a' at the wafer leading edge 122a and trailing edge 122b, respectively, are implemented to suppress the ECS signal undulations.

Figure 3B:
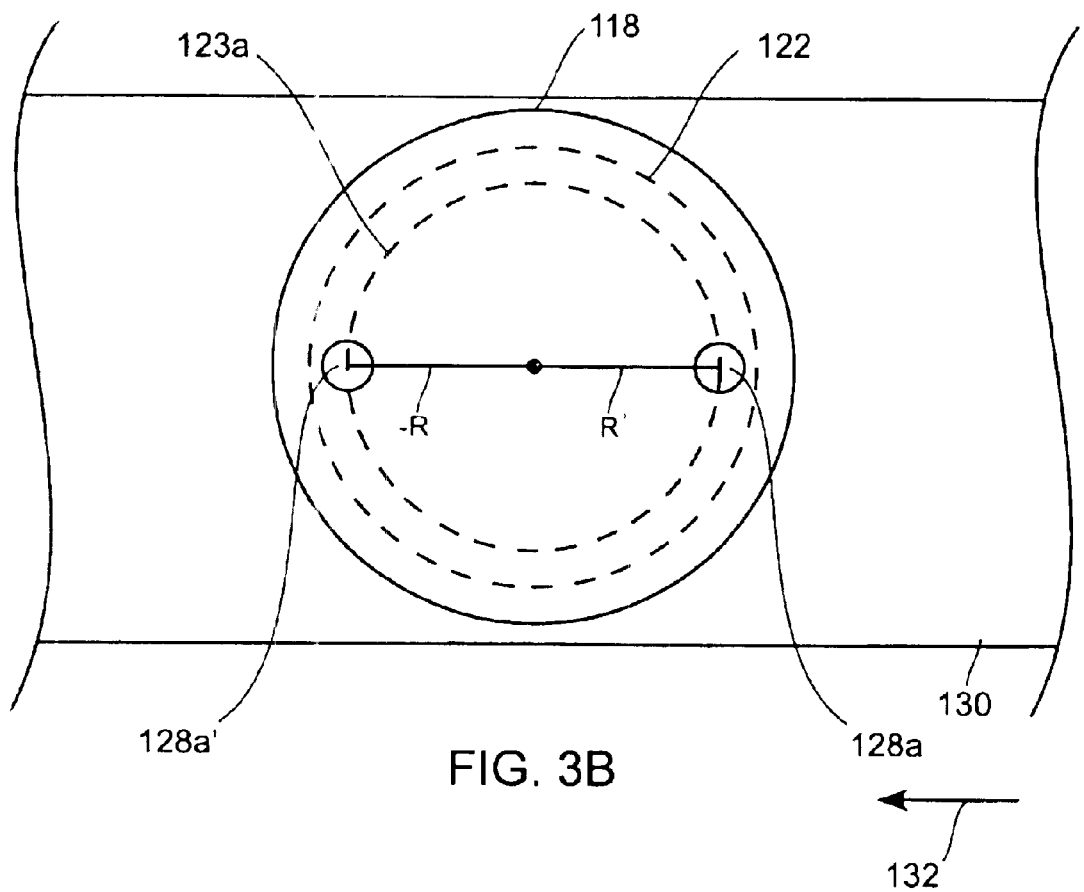
FIG. 3B is a simplified schematic top view diagram of wafer carrier and the pair of complementary eddy current sensors shown in FIG. 3A, in accordance with one embodiment of the invention.

Reference is made to FIG. 3B, depicting a simplified schematic top view of the wafer carrier 118 of FIG. 3A being applied to the polishing pad 130, in accordance with one embodiment of the present invention. As can be seen, while the ECS sensor 128a is defined on a radius R of a hypothetical circle 123a defined within the wafer 122, the complementary ECS sensor 128a' is defined on a radius −R of the hypothetical circle 123a. In this manner, as will be explained below, variation in signal undulation amplitude can be eliminated (i.e., eliminating any sinusoidal component of the noise) beneficially using one of the functions of sinus. As can be appreciated, the resulting suppressed sine signal substantially correlates with the true thickness of the target layer.

Figure 3C:
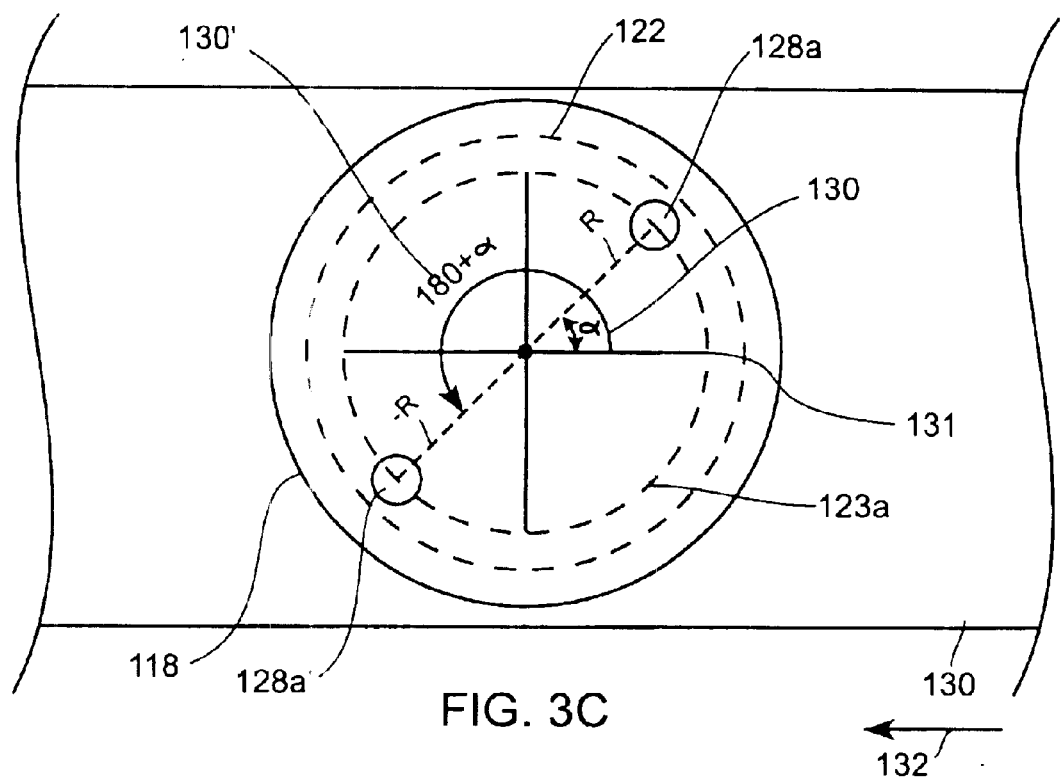
FIG. 3C is a simplified schematic top view diagram of another pair of exemplary eddy current sensors, in accordance with one embodiment of the invention.

FIG. 3C is a simplified schematic top view of the wafer carrier 118 of FIG. 3A showing the two ECS sensors 128a and 128a' being defined 180 degrees out of phase to one another, in accordance with one embodiment of the present invention. That is, the signal from one sensor 128a is offset by the signal from the other sensor 128a'. As can be seen, the ECS sensor 128a creates an angle α with reference to an angle 0 degree 131 while the ECS sensor 128a' creates an angle 180+α with reference to the angle 0 degree 131. As further shown, the ECS sensor 128a is defined at the radius R as opposed to the ECS sensor 128b that is defined at the radius −R.

In accordance with one embodiment, suppressing the variation in sinusoidal amplitude in the embodiment of FIG. 3C can further be understood as shown in Table 1 below. In one embodiment, assuming that S0 is the true signal magnitude sinusoidally modulated by the carrier rotation. As a result, the true signal magnitude S is configured to oscillate as:

$$S = S0(1 + \sin \alpha)$$

Furthermore, the signal traces S1 and S2 for corresponding sensor 1 and sensor 2 located at a given circle, each located at diametrically alternative positions, also follow oscillating equations provided in Table 1. By averaging the sine components of the signal traces S1 and S2, at the same time, the true non-oscillating signal amplitude in real time can be obtained.

TABLE 1

Two-Sensor Complementary Sine Signal Suppression

S1 = S0(1 + sin α)
S2 = S0(1 + sin(180 + α))
(S1 + S2)/2 = S0(1 + 1 + sin α + sin(180 + α))/2
(S1 + S2)/2 = S0(2 + 0)/2
(S1 + S2)/2 = S0*2/2
(S1 + S2)/2 = S0

Thus, as can be seen, where a pair of complementary ECS sensors is implemented, the sinusoidal signals generated by the respective sensors are synchronously recorded. The sine components of the sinusoidal signals are then averaged in accordance with the number of sensors implemented (e.g., 2, in this example). In this manner, variation in the amplitude of the ECS sinusoidal signals is suppressed, creating a signal that is substantially unaffected by the rotational sinusoidal noise that precisely correlates with the true thickness of the processed layer.

Figure 3D:
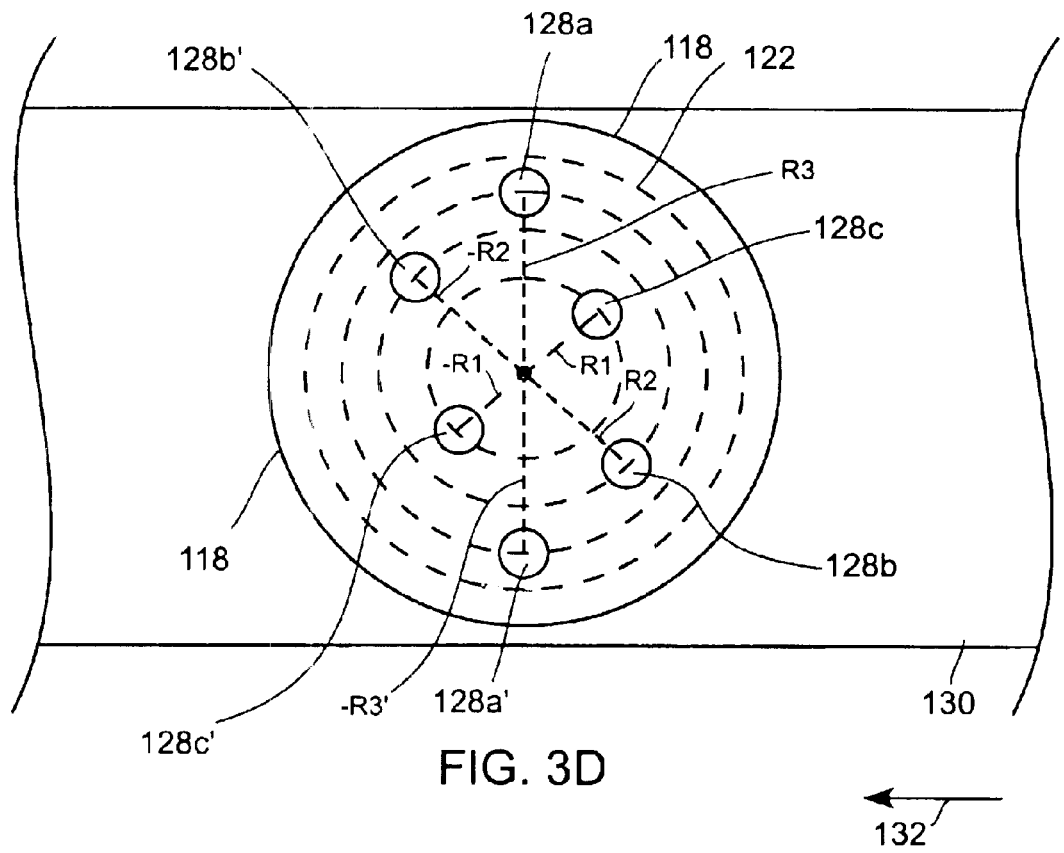
FIG. 3D is a simplified schematic top view diagram of an exemplary wafer carrier including three sets of complementary ECS sensors built therein, in accordance with one embodiment of the invention.

Reference is made to the embodiment of FIG. 3D, depicting a simplified schematic top view of the wafer carrier 118 including three sets of complementary ECS sensors built therein, in accordance with one embodiment of the present invention. As can be seen, a first set of complementary ECS sensors 128a and 128a' are defined at radii R1 and −R1, respectively. In a like manner, a second set of complementary ECS sensors 128b and 128b' are defined at radii R2 and −R2 while a third set of complementary ECS sensors 128c and 128c' are defined at radii R3 and −R3. In accordance with one embodiment, the sine component of the sinusoidal signals of each pair of complementary ECS sensors is synchronously recorded and averaged, generating a combination sine suppressed sinusoidal signal that significantly correlates with the thickness of the wafer layer. That is, by offsetting the sinusoidal signals between each pair of ECS sensors, the electromagnetic field produced by each pair of sensors will suppress each other. As can be appreciated, the average of each complementary pair of ECS sensors 128a and 128a', 128b and 128b', and 128c and 128c' are substantially equivalent to zero. As shown, the radius R3 is shown to be greater than radius R2 that in turn is greater than the radius R1. As will be described in more detail below, the greater the radius is, the greater the gradiance becomes. However, the embodiments of the present invention eliminate such variance in gradience by averaging the sine component of the sinusoidal signals recorded synchronously using the complementary ECS sensors.

Figure 4:
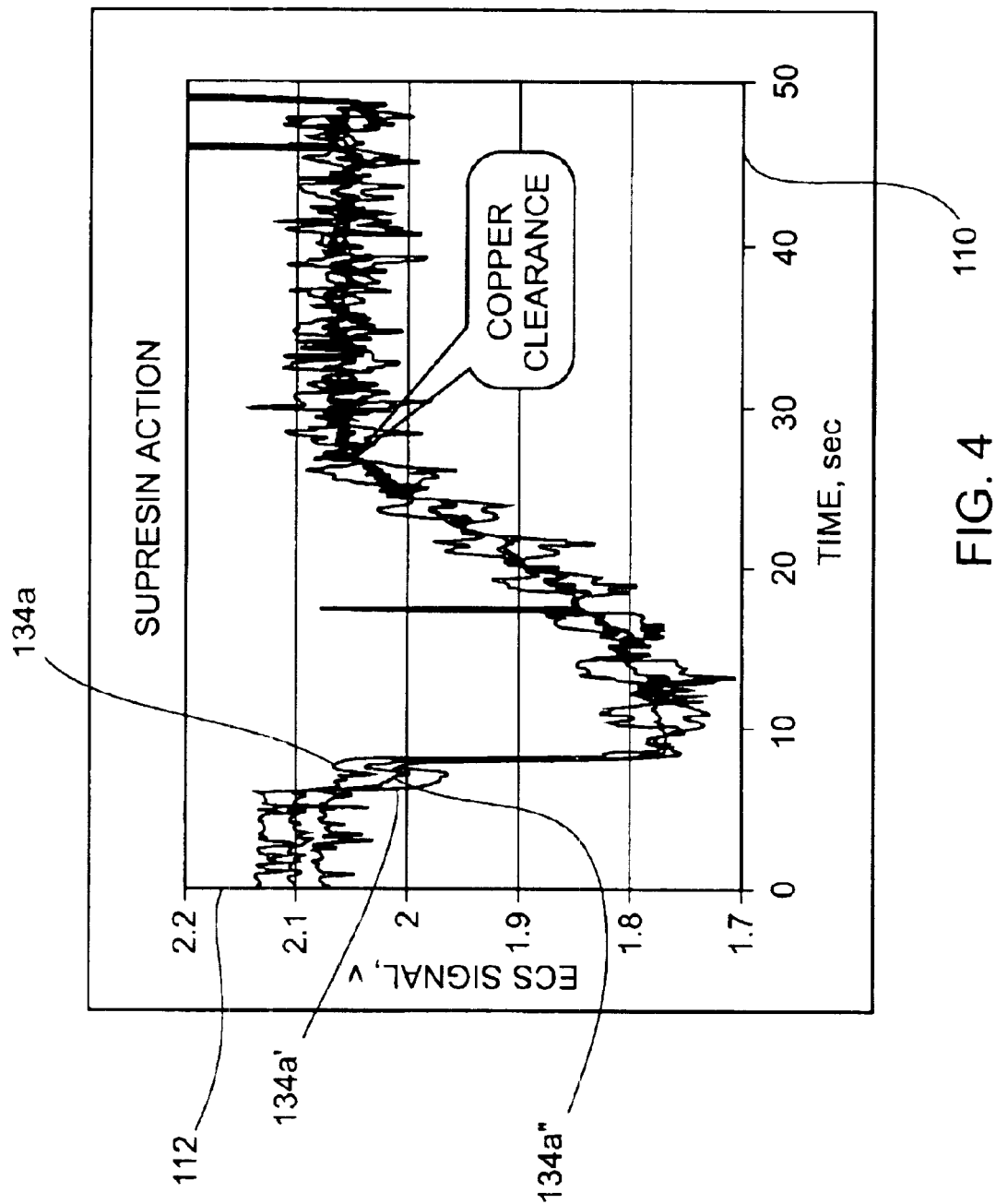
FIG. 4 depicts graphs of sinusoidal signals generated by an exemplary pair of complementary eddy current sensors, in accordance with still another embodiment of the invention.

Suppressing the variance in sinusoidal signal amplitude of ECS sensors are further illustrated in the graphs of signals generated by complementary ESC sensors shown in FIG. 4, in accordance with one embodiment of the present invention. A graph 134a plots an eddy current sensor output in volts (i.e., the y-axis 112) versus the time (i.e., the x-axis 110) as generated by the ECS sensor 128a'. Similarly, a graph 134a' plots an eddy current sensor output in volts versus the time, as generated by the ECS sensor 128a. A graph 134a" represents the average of the sine components of the sinusoidal ESC sensor signals 128a and 128a'. As can be appreciated, by averaging the sine component of the sinusoidal ECS signals of the ECS sensor defined on angle a on a circle having a radius R and the ECS signal of the ECS sensor defined on angle 180+α a on a radius −R, the sine component of the noise affecting the sinusoidal signals is substantially eliminated. Thus, in this manner, the thickness of the metal layer being processed substantially correlates with the amplitude of the sine suppressed combination signal. In one embodiment, the signal intensity is linearly related to the distance of the respective sensors 128a and 128a' from the wafer layer being processed. A change in the intensity of each signal caused by movement of the wafer layer toward the sensor 128a is offset by a substantially opposite change in the intensity resulting from moving the wafer layer from the sensor 128a'. In this manner, advantageously, changes in the amplitude of the sinusoidal signals caused by the sine component of the noise are substantially eliminated.

For instance, at the point the signals are shown to be at their lowest, the ECS sensors have substantially the least distance from the continuous metal film to be removed. Thereafter, as the thickness of the metal film becomes less, the intensity of the signals is shown to be increasing, as illustrated by graphs 134a and 134a'. The increase in signal intensity continues until the metal film (e.g., copper film) is substantially completely removed from the wafer surface at which point, the sinusoidal graphs 134a and 134a' assume a more smooth path.

As can be seen, signals generated by each sensor contains a sinusoidal component illustrated in the graphs 134a and 134a', which as can be appreciated are substantially equivalent but out of phase. Thus, the average of the two sinusoidal ECS signals having equal but out of phase amplitudes, the combo graph 134a", is a graph in which the sine component of the noise has been eliminated. In this manner, the combo sine suppressed signal can be implemented as a measure of the true thickness of the target layer (i.e., the metal film), as the sinusoidal ECS signal correlates with the thickness of the metal film. In one embodiment, the ECS sensors implemented are ECS sensors commonly available such as GP-A series analog displacement sensors available from SUNX limited.

Figure 5A:
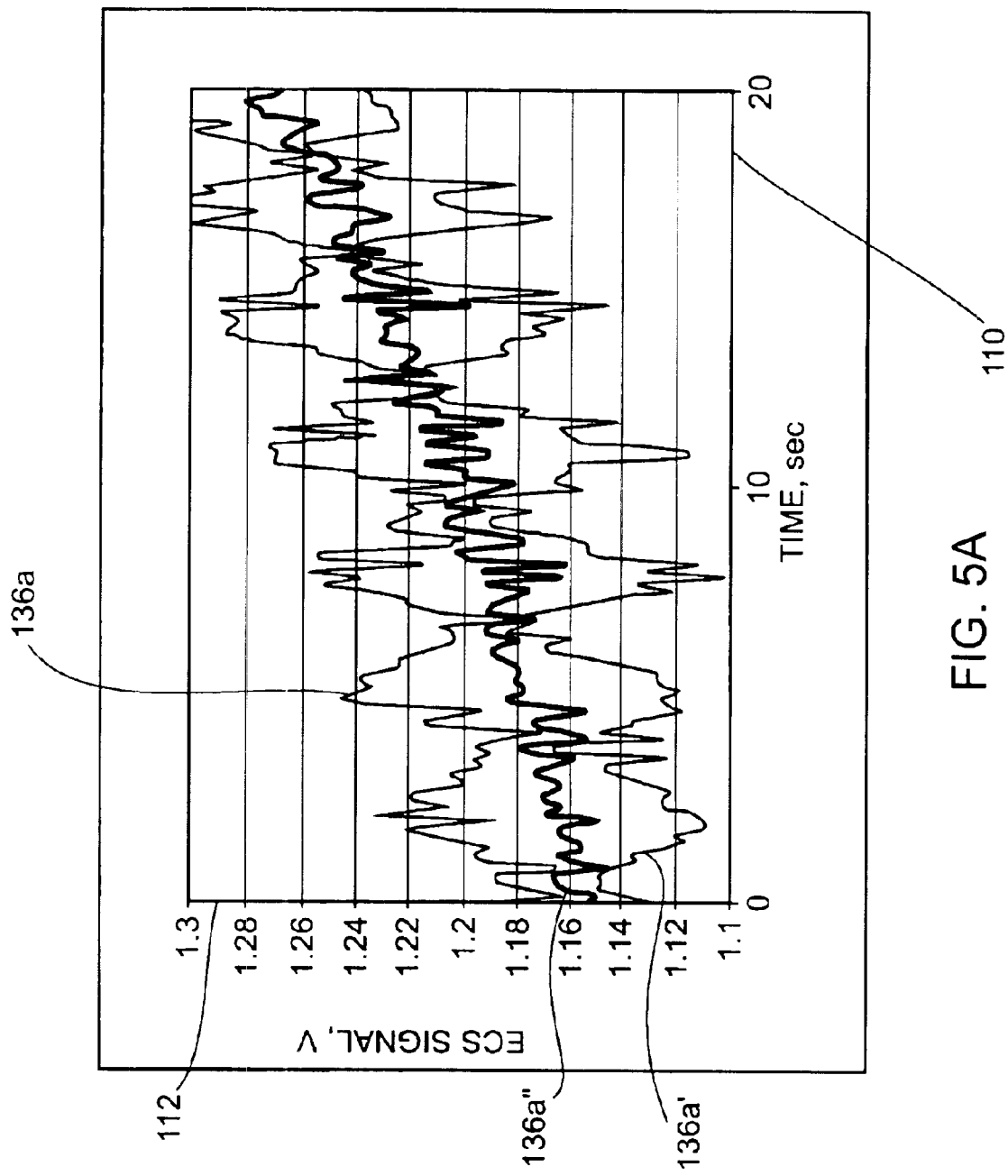
FIG. 5A depicts graphs of sinusoidal signals generated by an exemplary pair of complementary eddy current sensors, in accordance with one embodiment of the invention.
Figure 5B:
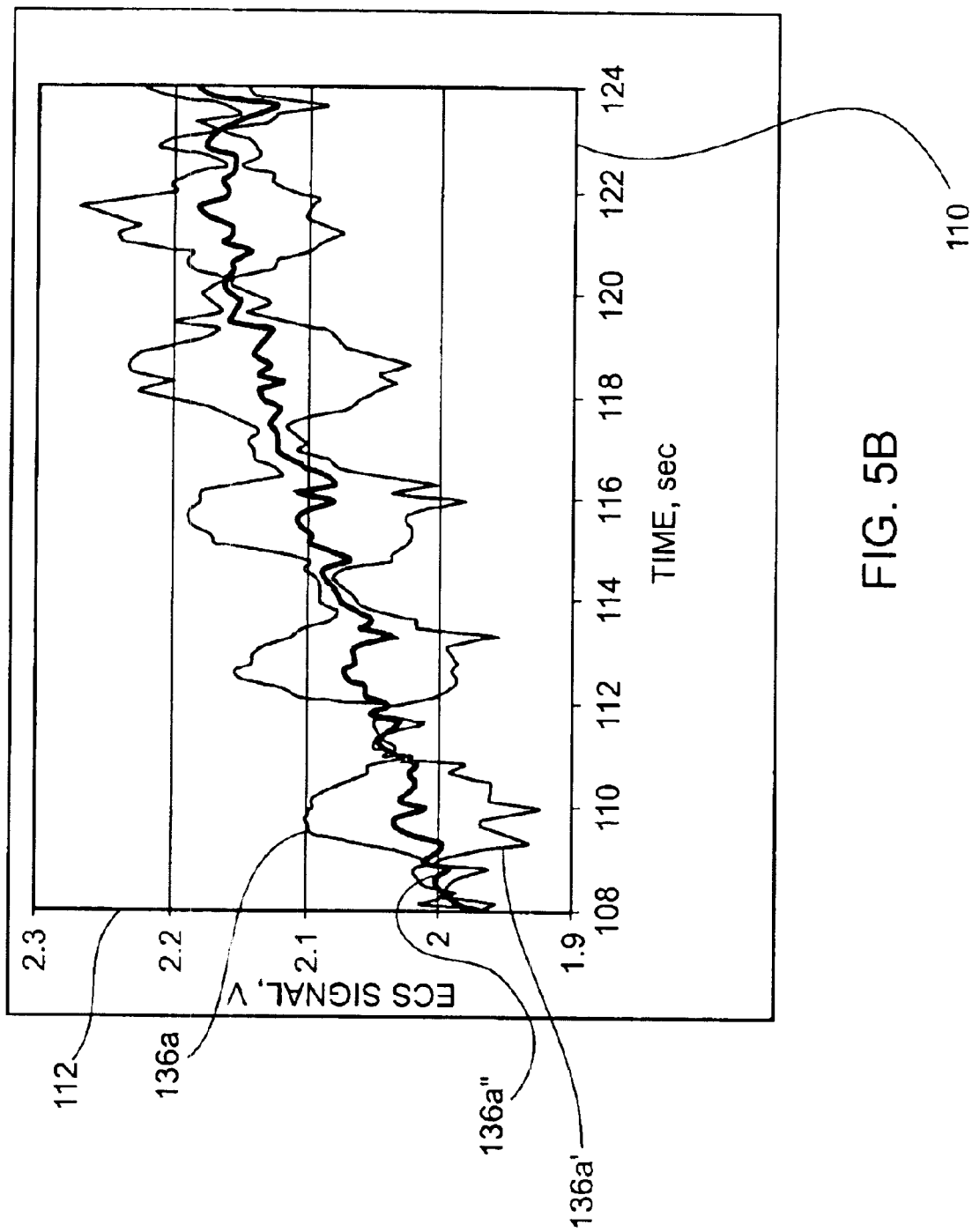
FIG. 5B depicts graphs of sinusoidal signals generated by the exemplary pair of complementary eddy current sensors, in accordance with one embodiment of the invention.

FIG. 5A is an exploded, simplified, diagram of graphs 136a and 136a' of a pair of complementary ECS sensors, in accordance with one embodiment of the present invention. As shown, the graph 136a represents the ECS signal from a sensor located at a radius R while the graph 136a' represents the ECS signal from a sensor located 180 degrees out of phase with respect to the first sensor, defined on the radius −R. One of ordinary skill in the art can appreciate variation in signal amplitude for the graphs 136a and 136a'. In accordance with one embodiment of the present invention, by implementing pairs of sensors being defined 180 degrees out of phase, the variation in signal amplitude can be eliminated substantially by simply averaging the sine components of the two signal graphs 136a and 136a', generating a sine suppressed graph 136a".

Figure 5C:
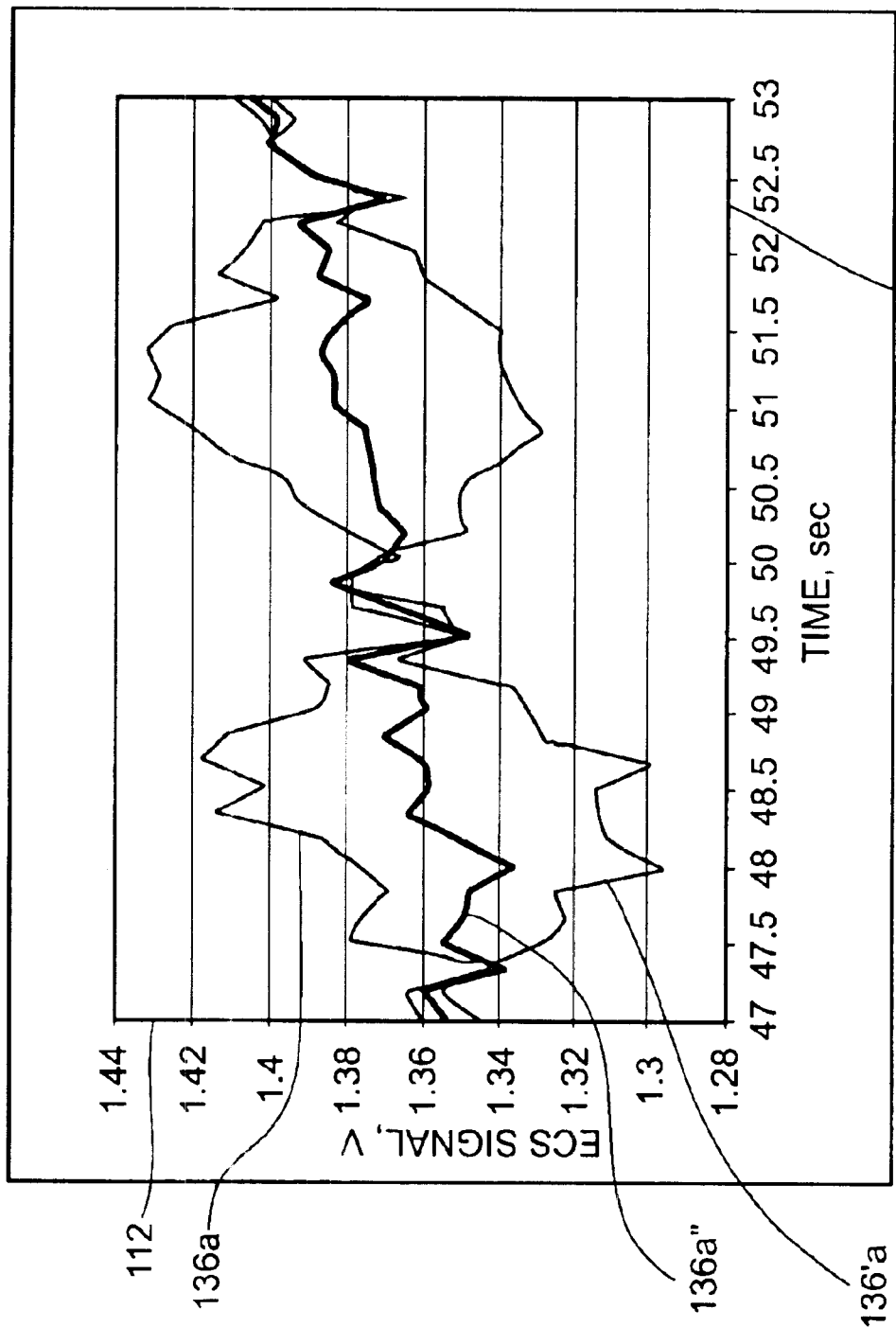
FIG. 5C depicts graphs of sinusoidal signals generated by the exemplary pair of complementary eddy current sensors, in accordance with one embodiment of the invention.

Reference is made to the exploded simplified graphs 136a, 136a', and 136a" shown in FIG. 5C, in accordance with one embodiment of the present invention. As shown, both graphs 136a and 136a' are sinusoidal with varied amplitudes, with the two graphs 136a and 136a' being generated by ECS signals defined at substantially 180 degrees out of phase angles. Despite the two graphs 136a and 136a' having evident amplitude variation and undulations caused by the noise, the combo graph 136a" is shown to be a sine suppressed signal graph in which undulations caused by the noise have been eliminated. As a result, the combo graph signal 136a" can be implemented to determine a true thickness of the metal film being removed.

Figure 6A:
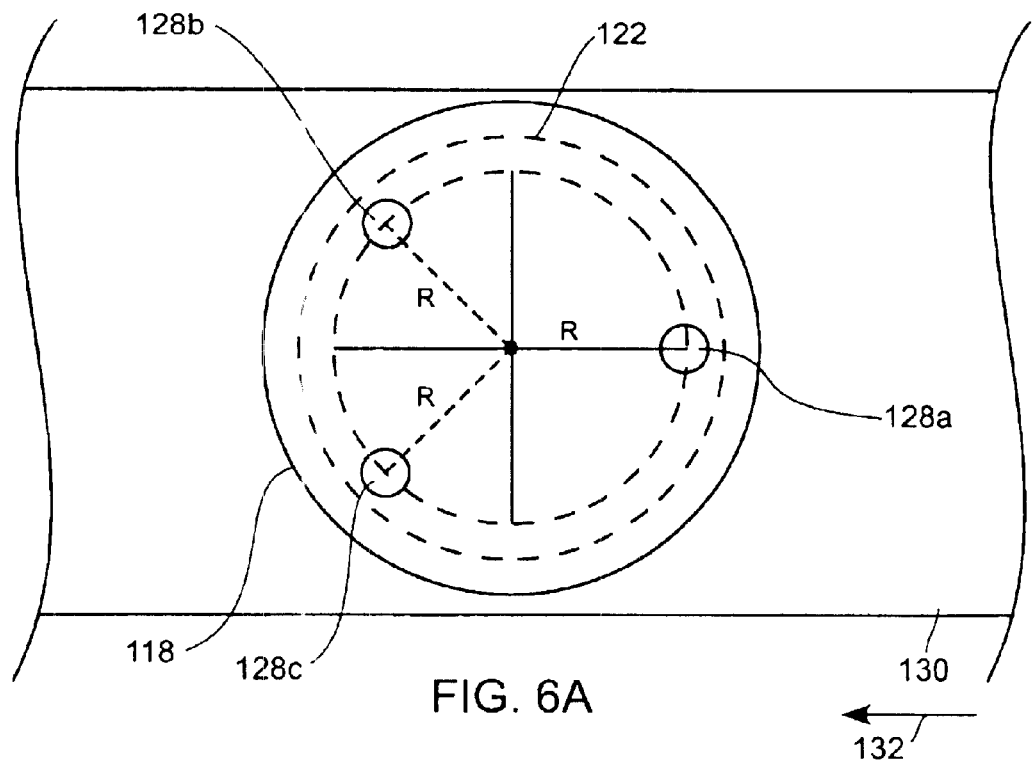
FIG. 6A is a simplified schematic top view diagram of a three-sensor complementary eddy current sensors for measuring thickness of a target layer, in accordance with still another embodiment of the invention.

Implementing a set of complementary ECS sensors including a plurality of complementary ECS sensors so as to create a sine suppressed combination graph is shown in embodiments of FIGS. 6A–6H, in accordance with some embodiments of the present invention. FIG. 6A shows a carrier head 118 including a set of three complementary sensors 128a, 128b, and 128c, with sensors 128a–c being defined 120 degrees out of phase with each other. In this manner, spatial coverage of the metal film (i.e., the target layer) increases, beneficially allowing a more accurate measurement of the metal film thickness. Table 2 below provides further explanation as to suppression of sensor signals generated by exemplary triplet-sensor complementary sensors, allowing synchronous measuring of the sensor signals and averaging of the sine components of the sensor signals.

TABLE 2

Figure 6B:
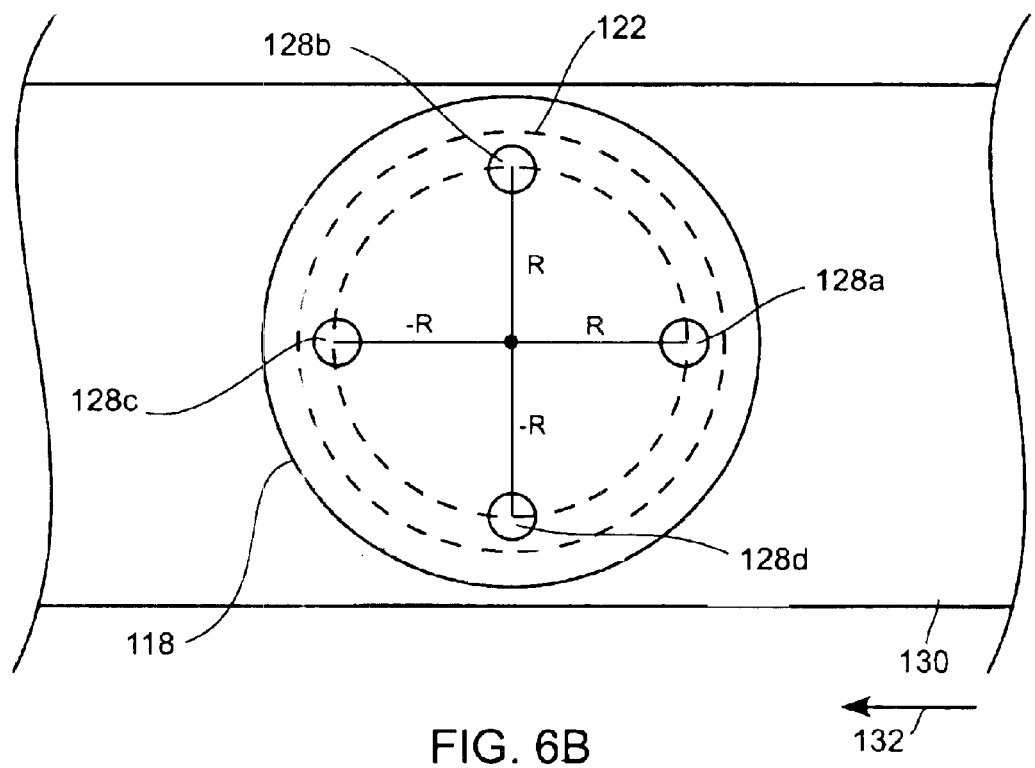
FIG. 6B is a simplified schematic top view diagram of a four-sensor complementary eddy current sensors for measuring thickness of a target layer, in accordance with still another embodiment of the invention.

Amplitude Suppression Implementing Three Complementary Sensors $(S1 + S2 + S3)/3 = S0(3 + \sin \alpha + \sin(\alpha + 120) + \sin(\alpha + 240))/3$
$\sin x + \sin y = 2 \sin((x + y)/2)\cos((x - y)/2)$
  $\sin(\alpha + 120°) + \sin(\alpha + 240)) =$
  $2[\sin(\alpha + 12 + \alpha + 240)/2][\cos(\alpha + 12 - \alpha - 240)/2]$
  $\sin(\alpha + 120°) + \sin(\alpha + 240) = 2[\sin(2\alpha + 360/2)][\cos(-120)/2]$
  $\sin(\alpha + 120°) + \sin(\alpha + 240) = 2[\sin(\alpha + 180)]\cos(-60)$
  $\sin(\alpha + 120°) + \sin(\alpha + 240) = 2(-\sin \alpha)(½)$
  $\sin(\alpha + 120°) + \sin(\alpha + 240) = \sin \alpha$
$(S1 + S2 + S3)/3 = S0(3 + \sin \alpha - \sin \alpha)/3$
$(S1 + S2 + S3)/3 = S0(3)/3$
$(S1 + S2 + S3)/3 = S0$ In a like manner, FIG. 6B shows a carrier head 118 including a set of complementary sensors consisting of four sensors 128a, 128b, 128c, and 128d with sensors 128a–d being defined along a circle having a radius R at 90 degrees out of phase with each other, in accordance with one embodiment of the present invention. In one embodiment, this configuration can be configured to be two pairs of sensors located diametrically opposite to one another.

Figure 6C:
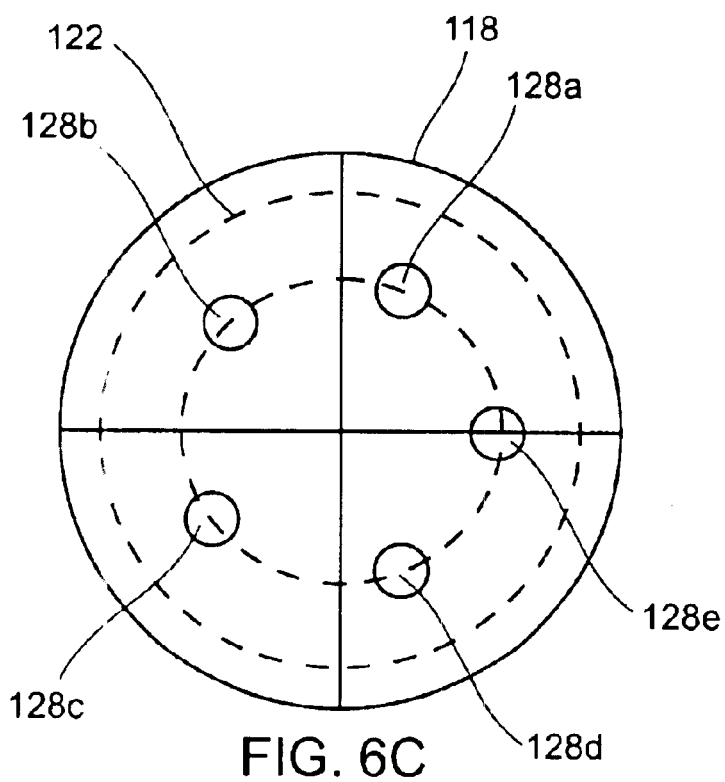
FIG. 6C is a simplified schematic top view diagram of a five-sensor complementary eddy current sensors for measuring thickness of a target layer, in accordance with still another embodiment of the invention.
Figure 6D:
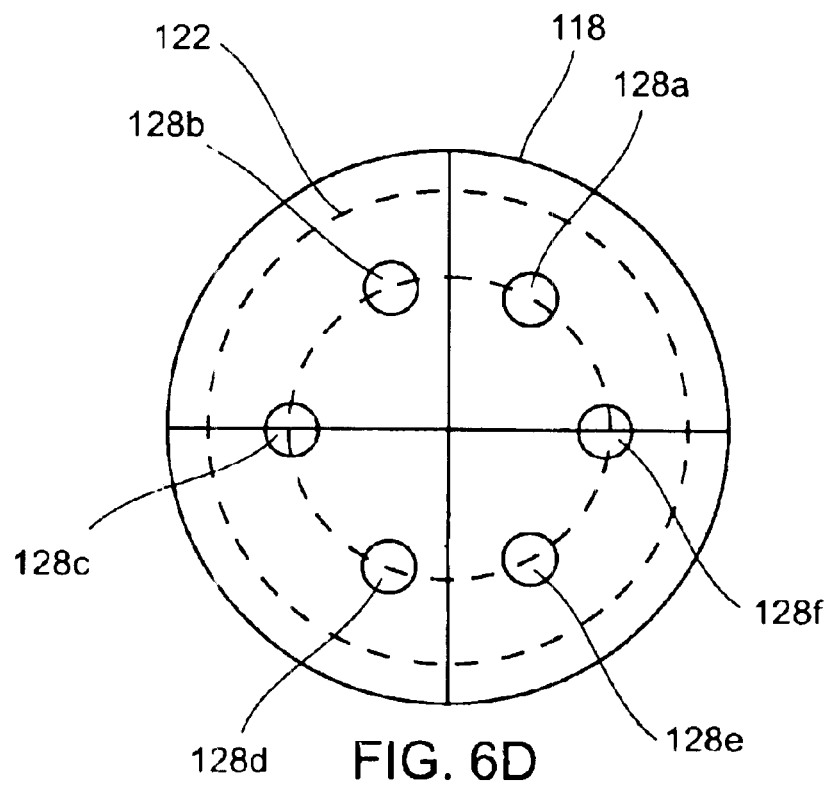
FIG. 6D is a simplified schematic top view diagram of a six-sensor complementary eddy current sensors for measuring thickness of a target layer, in accordance with still another embodiment of the invention.
Figure 6E:
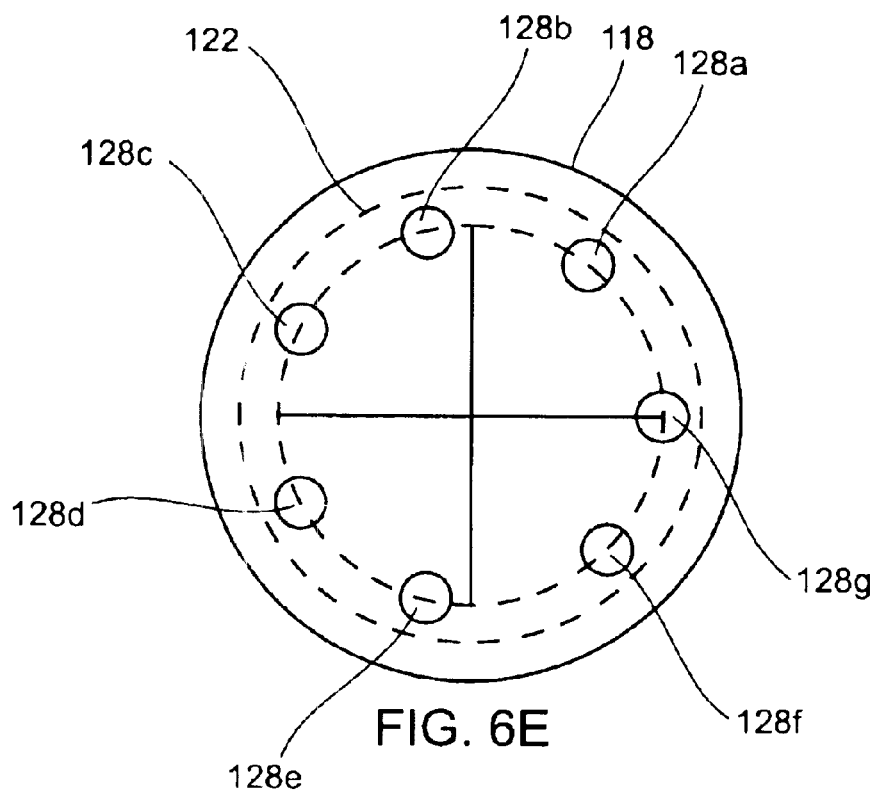
FIG. 6E is a simplified schematic top view diagram of a seven-sensor complementary eddy current sensors for measuring thickness of a target layer, in accordance with still another embodiment of the invention.
Figure 6F:
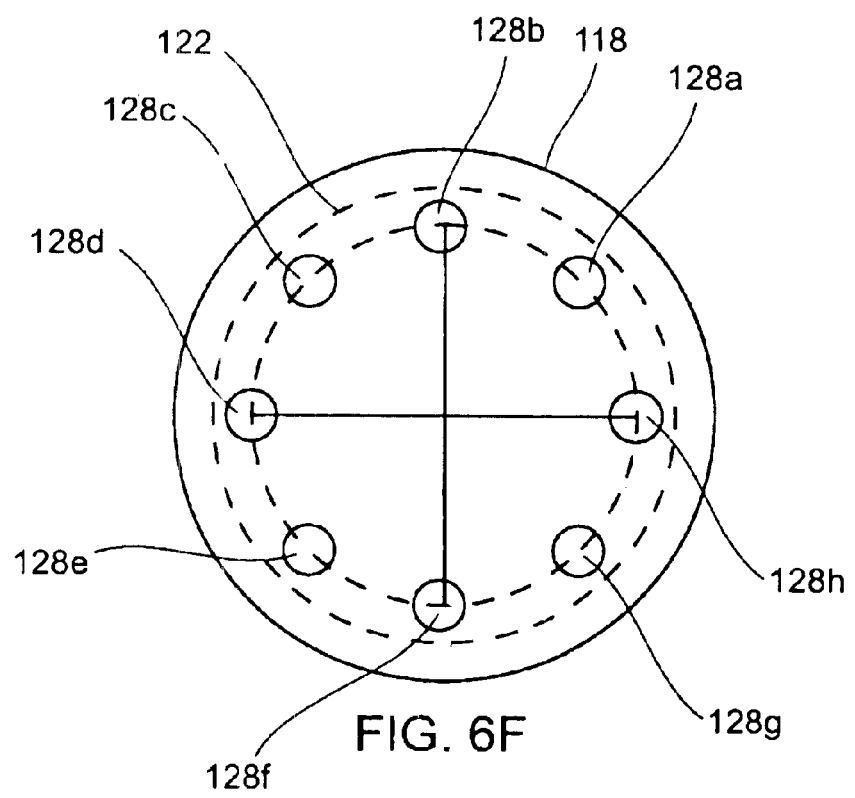
FIG. 6F is a simplified schematic top view diagram of an eight-sensor complementary eddy current sensors for measuring thickness of a target layer, in accordance with still another embodiment of the invention.

FIG. 6C depicts the wafer carrier 118 including five complementary sensors 128a–128e defined along a circle being 72° out of phase from each other, in accordance with still another embodiment. FIG. 6D shows six complementary sensors 128a–128f being defined 60° out of phase from each other, in accordance with another embodiment. FIGS. 6E and 6F depict the wafer carrier 118 including seven complementary sensors 128a–128g being defined 52° out of phase with respect to each other, and eight complementary sensors 128a–128h being defined 45° out of phase from one another, respectively. As was explained in more detail above, multi sets of complementary sensors can be implemented so as to create a sinus suppressed combination signal wherein the sine component of the noise has been eliminated, providing sensor signals that substantially correlate with the metal film thickness.

Figure 6G:
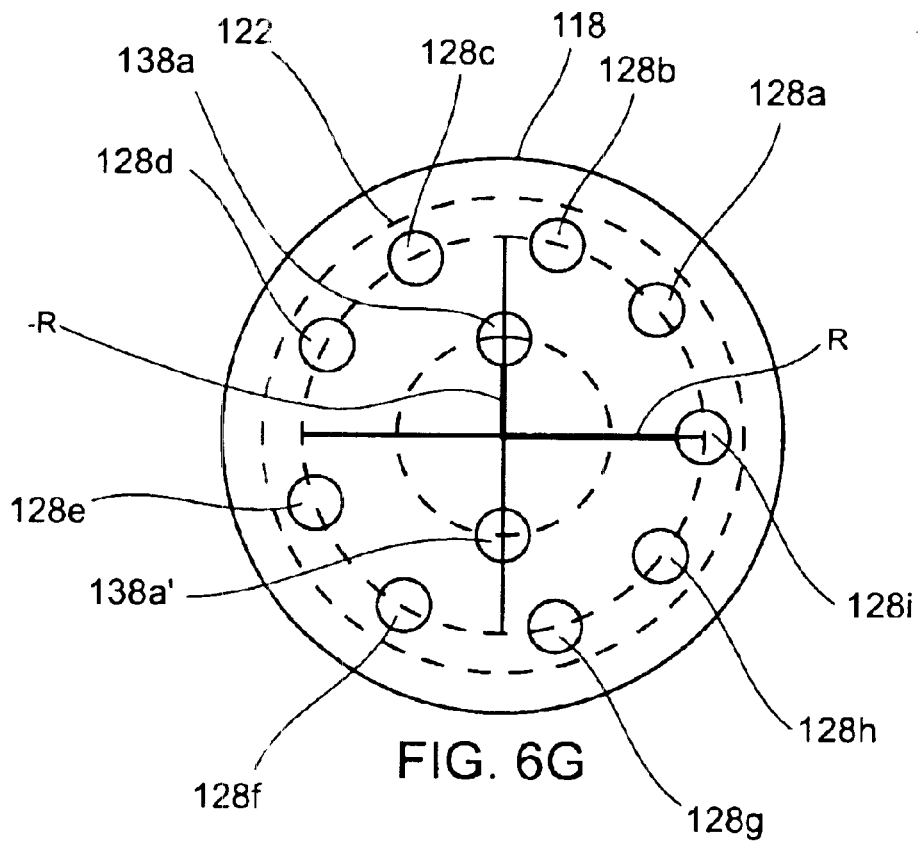
FIG. 6G is a simplified schematic top view diagram illustrating the implementation of multi-sets of complementary sensors to measure the thickness of a target layer, in accordance with still another embodiment of the invention.
Figure 6H:
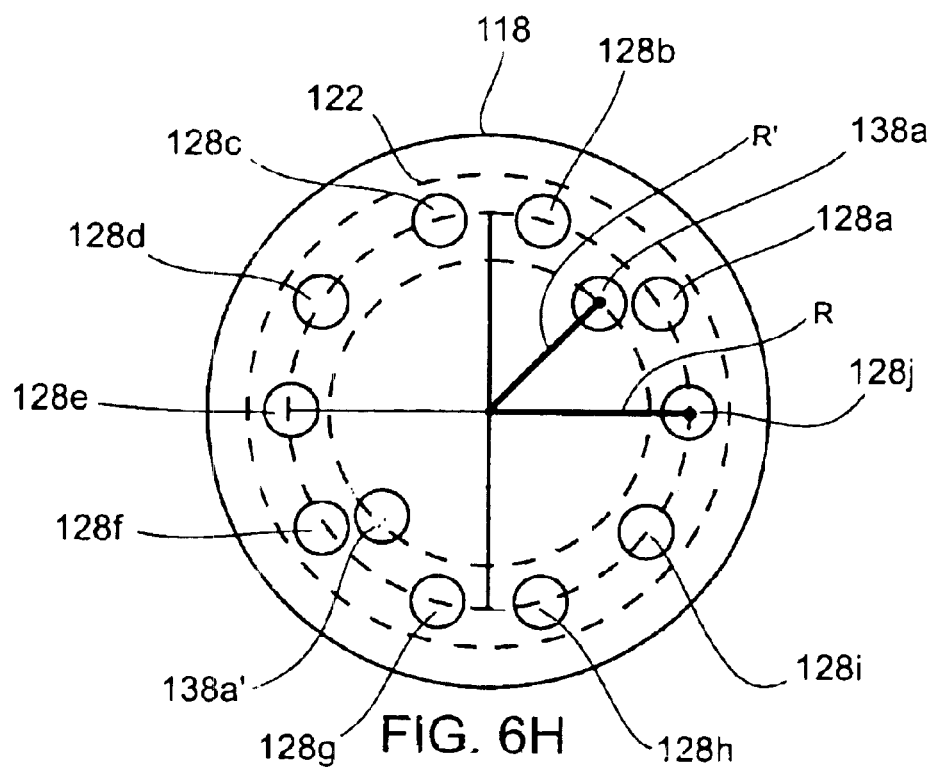
FIG. 6H is a simplified schematic top view diagram illustrating the implementation of multi-sets of complementary sensors to measure the thickness of a target layer, in accordance with still another embodiment of the invention.

Implementing multiple combinations of complementary sensors is depicted in the embodiments of FIGS. 6G and 6H, in accordance with one embodiment. As shown in FIG. 6G, complementary sensors 128a–128i are defined 40° out of phase and along a radius R within the wafer carrier 118 while the sensors 138a and 138a' are defined 180° out of phase along a radius R', in accordance with one embodiment. In this manner, the average of sine components of the signals generated by the sensors 138a and 138a' defined 180° out of phase with respect to one another provides the sine suppressed signal that substantially correlates to the thickness of the film at and around radius R'. In a like manner, the average of signals from the sensors 128a–128i defined 40° out of phase with respect to one another provides the sine suppressed signal that substantially parallels with the thickness of the film at and around radius R.

In one embodiment, temperature, pressure, or standoff gradiance becomes greater as the radius of the circle along which the sensors are defined increases. Thus, in the embodiment of FIG. 6G, due to the radius R being greater than the radius R', the temperature, pressure, or standoff gradience is larger. As a result, the generated sinusoidal sensor signals have a higher amplitude than the sinusoidal sensor signals generated along the radius R'.

FIG. 6H depicts a carrier head 118 including another combination of complementary sensors, in accordance with one embodiment of the present invention. As can be seen, ten complementary sensors 128a–128j are defined along the radius R and 36° out of phase with one another. Additionally, a combination of two complementary sensors 138a and 138a' are defined along a radius R' and 180° out of phase with each other.

Although the embodiments of the present invention have been shown to include two through ten complementary sensors, one of ordinary skill in the art must appreciate that the embodiments of the present invention may implement any suitable combination of uniformly and equally distributed sensors defined along the same circle of the carrier head to produce sinusoidal signals substantially correlating with the wafer layer thickness. Furthermore, one must appreciate that a multiplicity of combination of the equally distributed sensors defined along respective circles can be implemented to correlate with the thickness of wafer layer at respective locations of the sensors.

Furthermore, although some embodiments of the present invention have been described with ECS sensors, the embodiments of the present invention can be implemented to suppress signals generated by any suitable type of sensor (e.g., infrared, capacitance, sonic, etc.).

For instance, the infrared sensors may be implemented to measure the temperature of the polishing belt over time. It must be appreciated by one having ordinary skill in the art that as silicon substrate is transparent to the infrared signal, the infrared signal can detect the temperature of the thin film (i.e., target layer) of the wafer being processed by the surface of the polishing pad. In one embodiment, the wafer temperature is monitored to observe temperature variation during the CMP process. In one implementation, the temperature of the wafer and the temperature of the polishing pad begin to decrease at the endpoint.

Figure 7:
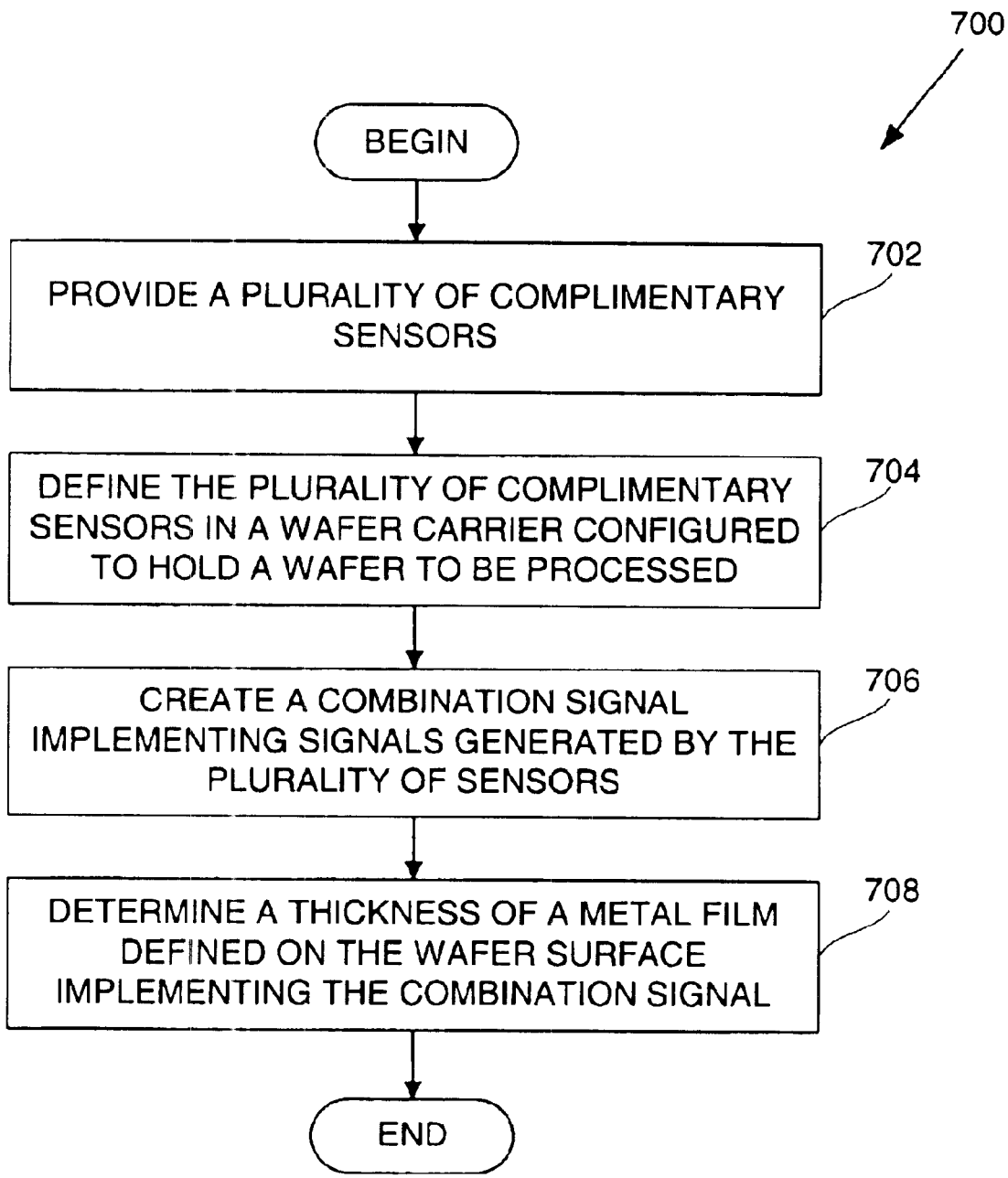
FIG. 7 is a flowchart diagram depicting operations performed to determine the thickness of a metal film using a plurality of complementary sensors, in accordance with still another embodiment of the present invention.

FIG. 7 is a flowchart diagram 700 depicting operations performed to determine the thickness of a metal film using a plurality of complementary sensors, in accordance with one embodiment of the present invention. The method begins in operation 702 in which a plurality of complementary sensors is provided. In one embodiment the plurality of sensors are ECS sensors. The plurality of complementary sensors is defined within a wafer carrier configured to hold a wafer to be processed. In one embodiment, the wafer to be processed includes a metal film. Then, a combination signal is created using signals generated by the plurality of sensors. A thickness of the metal film defined on the wafer surface is then determined using the combination signal. As described in more detail above, the sine suppressed combination signal is substantially unaffected by the sine component of the noise, significantly correlating with the thickness of the film layer being removed.

Figure 8:
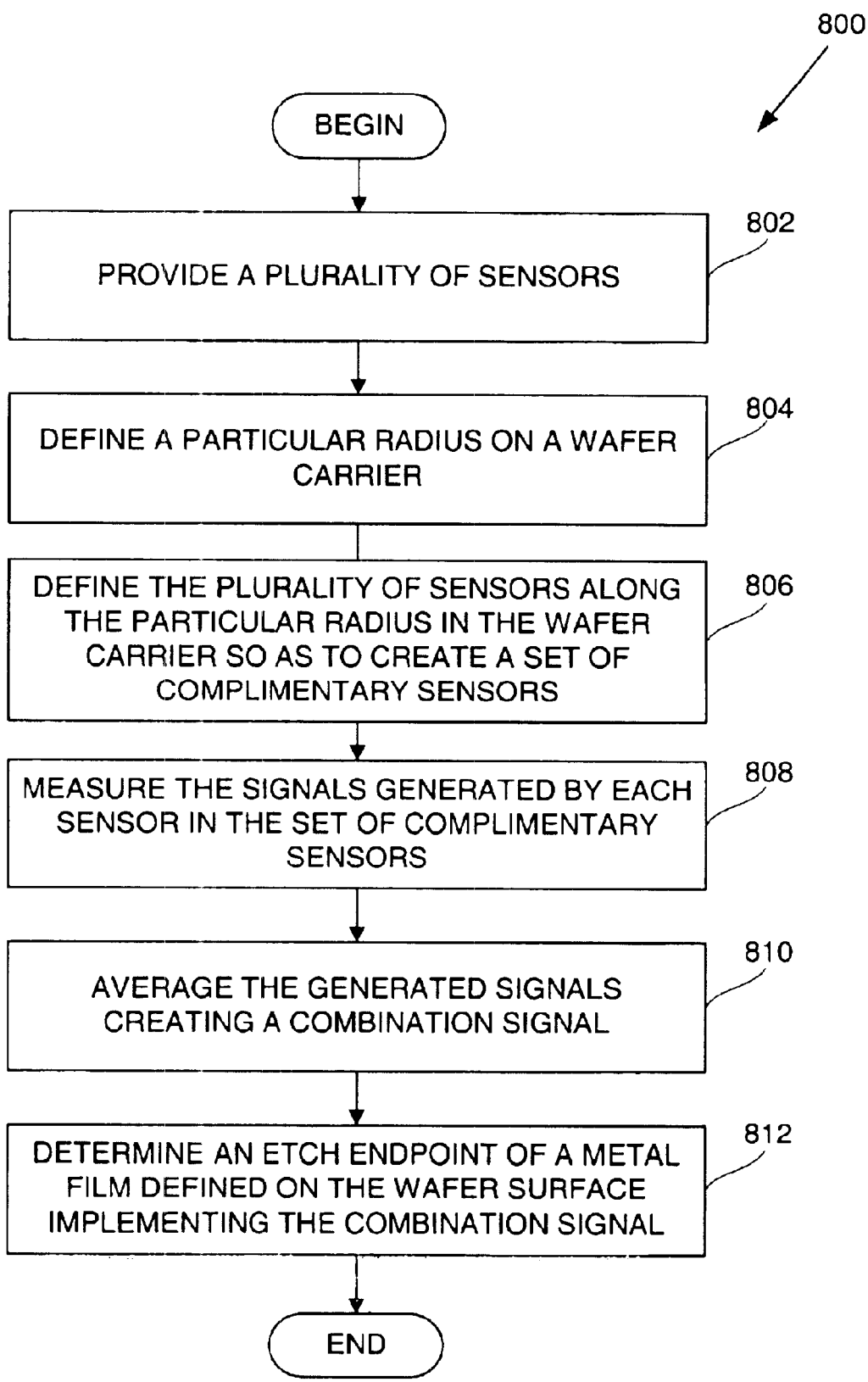
FIG. 8 is a flow chart diagram illustrating method operations performed in detecting etch endpoint through implementing a plurality of complementary sensors, in accordance with yet another embodiment of the present invention.

Reference is made to the flowchart 800 depicted in FIG. 8 illustrating method operations performed in detecting etch endpoint implementing a plurality of complementary sensors, in accordance with another embodiment of the present invention. The method begins in operation 802 in which a plurality of sensors is provided. Next, in operation 804, a particular circle defined by the radius on a wafer carrier is defined. Thereafter, the plurality of sensors is defined along the particular radius within the wafer carrier in operation 806, creating a set of anti-phase complementary sensors. In one example, the sensors are complementary so long as the sensors are uniformly distributed along the particular radius in the wafer carrier generating a significantly suppressed sine signal. For instance, the set of complementary sensors may include two sensors, each being 180 degree out of phase with respect to the other, threes sensors being 120 degrees out of phase with each other, four sensors being 90 degrees out of phase with each other, etc.

The method then continues to operation 808 in which the signals generated by each sensor in the set of complementary sensors are measured proceeding to operation 810 in which the sine component of the generated signals are averaged, creating a combination signal. Continuing to operation 812, an etch endpoint of a metal film defined on the wafer surface is determined using the combination signal.

It should be appreciated that although in one embodiment the wafer carrier is aligned with the polishing pad using a gimbal, the embodiments of the present invention are not limited to CMP systems including that implement a gimbal. Additionally, although one embodiment of the present invention is shown to be implemented in CMP systems including linear polishing pads, in a different embodiment, any appropriate polishing table may be implemented (e.g., rotary, etc.) Furthermore, while the embodiments of the present invention have been described in terms of a CMP process, the complementary sensors are not limited to a CMP process. For example, the sensors can be used within any semiconductor process that removes or deposits a layer or film on a substrate, such as etch and deposition processes. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A method for detecting a thickness of a layer of a wafer, the method comprising:
   defining a particular radius of a wafer carrier, the wafer carrier configured to engage the wafer to be processed;
   providing a plurality of sensors configured to create a set of complementary sensors;
   distributing the plurality of sensors along a particular circle within the wafer carrier such that each sensor is out of phase with an adjacent sensor by a same angle;
   measuring signals generated by the plurality of sensors; and
   averaging the signals generated by the plurality of sensors so as to generate a combination signal, the averaging being configured to suppress oscillating disturbance in the combination signal, the combination signal capable of being correlated to identify the thickness of the layer.

2. A method as recited in claim 1, wherein the thickness of the wafer layer can be determined in situ.

3. A method as recited in claim 2, wherein in situ is defined as determining the thickness of the layer as the layer being processed.

4. A method as recited in claim 1, wherein the combination signal is implemented to determine an endpoint of the layer.

5. A method as recited in claim 1, wherein the plurality of sensors are eddy current sensors.

6. A method as recited in claim 1, wherein the signals generated by the plurality of sensors are out of phase.

7. A method as recited in claim 6, wherein averaging the signals generated by the plurality of sensors substantially eliminates signal suppression.

8. A method for detecting a thickness of a conductive layer of a wafer, the method comprising:
   defining a particular radius of a wafer carrier, the wafer carrier configured to engage the wafer to be processed;
   providing a pair of sensors;
   defining the pair of sensors along the particular radius of the wafer carrier such that a first sensor of the pair of sensors is out of phase with a second sensor of the pair by a predetermined angle;
   measuring signals generated by the first sensor and the second sensor of the pair of sensors;
   averaging the signals generated by the first sensor and the second sensor so as to generate a combination signal, the averaging being configured to remove noise in the combination signal, the combination signal capable of being correlated to identify the thickness of the conductive layer.

9. A method as recited in claim 8, wherein the first sensor is out of phase with the second sensor by 180 degrees.

10. A method as recited in claim 8, wherein the pair of sensors are eddy current sensors.

11. A method as recited in claim 8, wherein defining the first sensor of the pair of sensors out of phase with the second sensor of the pair of sensors is configured to substantially eliminate signal suppression.

12. A method as recited in claim 8, wherein an intensity of signals generated by the first sensor and the second sensor of the pair of sensors correlates with the thickness of conductive layer.

13. A method as recited in claim 8, wherein the thickness of the conductive layer can be determined in situ.

14. A method as recited in claim 13, wherein in situ is defined as determining the thickness of the conductive layer as the conductive layer being processed.

15. An apparatus for detecting a thickness of a conductive layer of a wafer configured to be engaged by a wafer carrier, the apparatus comprising:

a plurality of sensors configured to detect a signal produced by a magnetic field being generated by a magnetic field enhancing source, the plurality of sensors being defined along a circle defined within the wafer carrier such that each sensor of the plurality of sensors is out of phase with an adjacent sensor by a predetermined angle, wherein an average of signals generated by the plurality of sensors is configured to create a combination signal.

16. An apparatus as recited in claim 15, wherein an amplitude of the combination signal is configured to be substantially proportional to the thickness of the conductive layer.

17. An apparatus as recited in claim 16, wherein in situ is defined as determining the thickness of the conductive layer as the conductive layer being processed.

18. An apparatus as recited in claim 15, wherein each sensor in the plurality of sensors is an eddy current sensor.

19. An apparatus as recited in claim 15, wherein the combination signal is implemented to determine the thickness of the conductive layer.

20. An apparatus as recited in claim 15, wherein the thickness of the conductive layer can be determined in situ.

21. A method for detecting a thickness of a conductive layer of a wafer to be engaged by a wafer carrier, the method comprising:

defining a pair of sensors along a particular radius of the wafer carrier such that a first sensor of the pair of sensors is out of phase with a second sensor of the pair of sensors by a predetermined angle; and averaging signal generated by the first sensor and the second sensor of the pair of sensors as to generate a combination signal capable of being correlated to identify the thickness of the conductive layer.

* * * * *